United States Patent [19]

Henry et al.

[11] 4,437,077
[45] Mar. 13, 1984

[54] SEMICONDUCTOR DEVICE USABLE AT VERY HIGH FREQUENCIES AND ITS PRODUCTION PROCESS

[75] Inventors: Raymond Henry; Michel Heitzmann, both of Paris, France

[73] Assignee: Thomson-CSF, Paris, France

[21] Appl. No.: 288,690

[22] Filed: Jul. 31, 1981

[30] Foreign Application Priority Data

Aug. 8, 1980 [FR] France ............................ 80 17533

[51] Int. Cl.³ ............................................. H01P 1/00
[52] U.S. Cl. .................... 333/245; 333/99 R; 357/68
[58] Field of Search ............. 333/243, 245, 263, 99 R; 357/68; 29/577 R, 589

[56] References Cited

U.S. PATENT DOCUMENTS 3,821,614  6/1974  Schmidt ........................... 357/68
4,151,494  4/1979  Nishikawa et al. ............. 333/206 X Primary Examiner—Paul L. Gensler

[57] ABSTRACT

The impedance value of the semiconductor device usable at very high frequencies is preset during manufacture.

The device comprises a Gunn or Zener diode coupled to a coaxial line. The central conductor of the line is constituted by a metal wire mandrel or a metal coating deposited on a glass fibre section.

The outer cylinderical conductor is a cylindrical metal coating deposited on a ring of dielectric material, such as glass and which surrounds the diode.

Application to microstrip, transmitting antenna and radial cavity circuits.

4 Claims, 4 Drawing Figures

4,437,077

SEMICONDUCTOR DEVICE USABLE AT VERY HIGH FREQUENCIES AND ITS PRODUCTION PROCESS

BACKGROUND OF THE INVENTION

The invention relates to a semiconductor device which can be used at very high frequencies and whose impedance value can be preset during manufacture. It also relates to a production process for such a device.

A semiconductor device is known which can be used at very high frequencies and in which a cylindrical ring of dielectric material with metallized planar faces is arranged around a Gunn or Zener diode. This ring is welded by one of its metallized faces to a metal support to which is electrically and thermally connected a widened base of the diode. A metallized fibre section is introduced into the ring and provides a polarization contact between the diode and the other metallized face of the ring.

The aforementioned arrangement makes it possible to form a radial impedance transforming cavity. However, it cannot easily be adjusted to a predetermined impedance value, which is a disadvantage in the use of this device. It is also far from easy to use due to the very limited dimensions of the fibre section and in particular its length.

BRIEF SUMMARY OF THE INVENTION

The present invention proposes for the purpose of obviating the aforementioned disadvantages a process for producing a device, which can operate at a very high frequency and which has a coaxial line, whose impedance can be preset during manufacture. The invention is also directed at providing improvements to the construction of the device in order to make its manufacture easier and offer a greater scope for adding circuits of the microstrip, transmitting antenna or radial cavity types.

Therefore, the invention relates to a production process for a semiconductor device usable at very high frequencies and comprising the following stages:

manufacture of n diodes usable at very high frequencies and fixed to a common plate;

preparation of n cylindrical rings made from dielectric material having at least one planar end which is metallized;

preparation of n cylindrical mandrels having at least one cylindrical layer of a metal which is a good conductor of electrically and whose external diameter is less than the internal diameter of the rings;

metallization of the outer cylindrical wall of the rings and at least one of its end faces;

formation of a convex end and an opposite planar end on the n mandrels;

metallization of the end surfaces of the mandrels;

each diode is surrounded by one of the rings and the rings are welded by their metallized face to the common plate;

introduction of the n mandrels into the n rings by placing the metallized convex ends in contact with the diodes;

hermetic sealing of the gaps between the mandrels and the rings by a thermosetting resin joint;

cutting the plate into individual steps, each supporting a diode surrounded by a ring and in contact with a mandrel, both metallized in the manner referred to hereinbefore;

fitting of each step to a screw metal support by means of an appropriate weld.

The semiconductor device according to the invention comprises a diode of the type functioning at very high frequencies and a coaxial line with presettable impedance constituted by a cylindrical ring, which is concentric to the diode, has an internal diameter d1, an external diameter d2, a predetermined length h, is made from dielectric material and has on its outer cylindrical surface and on one of its ends, at least one metal coating and a cylindrical mandrel of external diameter smaller than diameter d1, of length L at least equal to the length h of the ring, said mandrel having a convex end and an opposite planar end, whilst incorporating at least one cylindrical metal layer which is a good conductor of electricity.

BRIEF DESCRIPTION OF THE DRAWINGS

The invention is described in greater detail hereinafter relative to non-limitative embodiments and with reference to the attached drawings, wherein show.

DETAILED DESCRIPTION OF THE PREFERRED EMBODIMENTS

The production process for the semiconductor device according to the invention aims more particularly at the provision of a coaxial line of preset impedance having extremely reduced dimensions and which is coupled to a diode usable in high frequency so as to hermetically encapsulate the same.

Figure 1:
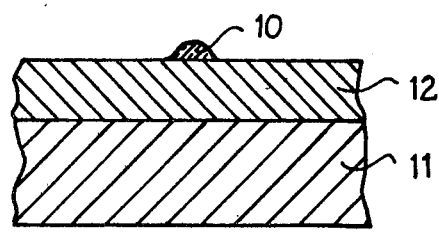
FIG. 1 a sectional view of a diode support carrying a diode and which can be used as a basis for the process according to the invention.

A diode 10 usable at very high frequencies, e.g. a Gunn or Zener diode, is used as a basis for producing the semiconductor according to the invention. A preliminary stage with respect to the process according to the invention is shown in FIG. 1 and consists of producing by appropriate chemical etching on a metal support 11 covered by a gold plate 12 a plurality of diodes in the form of a "mesa" and then separating the support 11 from plate 12 carrying diode 10, the latter remaining fixed to the gold plate 12.

Figure 2:
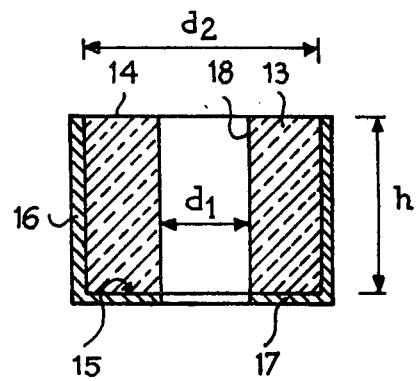
FIG. 2 a sectional view of a ring for the semiconductor device according to the invention.

The actual process of the invention shown in FIG. 2 is started by preparing cylindrical rings 13 made from dielectric material and having two terminal faces 14, 15, which are preferably made planar and parallel to one another.

The outer cylindrical surface of the rings 13 is then covered by at least one metal coating 16. Simultaneously or separately, at least one metallized coating 17 is deposited on face 15 of rings 13. Preferably, a titanium coating and then a gold coating of total thickness between 1 micron and several microns are deposited successively by evaporation. These metal coatings form the outer cylindrical conductor 16 of the structure of a coaxial line permitting the setting of the impedance of the semiconductor device, whilst coating 17 is used for welding ring 13 to plate 12. Rings 13 are, for example, obtained by cutting calibrated glass tubes having an internal diameter d1 between 120 and 130 microns and an external diameter d2 of approximately 1000 microns. Preferably, a glass tube with a relative dielectric constant ε equal to or close to 6 is cut into sections.

During the following stage of the process each ring 13 is placed around a diode 10 so as to surround the latter by its inner cylindrical wall 18. The metallized face 15 is then welded to plate 12 by means of a soft solder of the indium—tin type in order to prevent to the maximum possible mechanical stresses.

Figure 3:
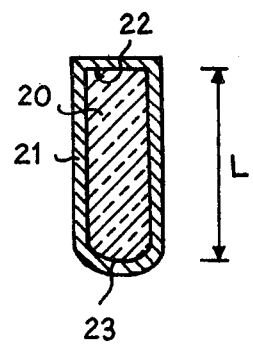
FIG. 3 a sectional view of a mandrel of the device according to the invention.

The following stage shown in FIG. 3 relates to the production of the central conductor of the coaxial line which is to be coupled to a diode 10.

This conductor is formed e.g. by depositing one or more coatings 21 of metals on the surface of a dielectric mandrel 20, which can be constituted by an optical glass fibre section. Its length L then slightly exceeds the length h of the preceding ring and has a convex end 23 and an opposite planar end 22. The diameter of the mandrel can be slightly less than that of the central passage of ring 13 in such a way that after metallizing the mandrel, the latter can be inserted into the said passage.

The convex end 23 of the mandrel is produced by microfusion of the glass followed by its cooling. It is then metallized. The convexity facilitates the contacting of the mandrel with the top of the diode 10, already welded by its base to gold plate 12.

Instead of being constituted by the metallized glass section, the central conductor can be formed by a mandrel 20 constituted by a metal wire section which is a good conductor of electricity and whose diameter is smaller than the central passage of ring 13.

A good contact with the diode can be ensured by thermal compression of microbrazing between the ohmic contact of the top of the diode 10 and the metallized convex end 23. The metal deposited on the latter is preferably gold. In the case of a glass mandrel, the gold is deposited on a titanium undercoating already deposited on the glass surface.

Figure 4:
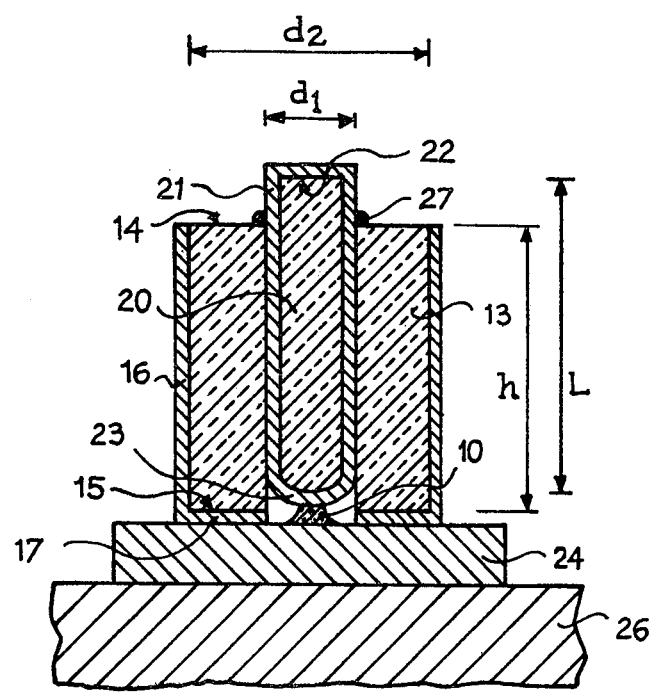
FIG. 4 a section through a preferred embodiment of a semiconductor device according to the invention.

Once introduced into the central passage of the ring, the mandrel 20 acts in the manner of a plug, this being shown in FIG. 4. The gap between the ring and the mandrel is then hermetically sealed by appropriate means, e.g. a thermosetting resin joint 27 connecting the mandrel 20 to the contiguous edge of the planar end 14 of ring 13.

The following operation consists of separating the semiconductor devices encapsulated in this way during the preceding operations by appropriately cutting plate 12 into individual steps 24, each of which carries a device. However, instead of cutting plate 12 at that time of manufacture, it can be cut into individual steps before the start of the welding operation for rings 13, followed by the application of the aforementioned process. The recommended method has the advantage of a better adaptation to mass production and is consequently better from an industrial standpoint.

Each of the individual devices is then welded via the step 24 to a metal support 26 (e.g. a conventional screw support) by means of an appropriate weld. The device is then completed by conventional processes providing it with the necessary protection and external connection means.

The coaxial line constituted by metal coatings 16 and 21 has an impedance value Z which is roughly equal to:

$$\frac{138}{\sqrt{\epsilon}} \text{Log}\left(\frac{d2}{d1}\right).$$

This value Z can therefore be modified by simply changing the three variables d1, d2 and ε. For example, on choosing ε=6, d1=125 microns, d2=1000 microns, an impedance value Z close to 50 Ohms is obtained.

The length h of the coaxial line section can be between 1.23 and 1.8 mm for operating frequencies close to 100 GHz.

What is claimed is:

1. A semiconductor device comprising:
   a diode of the type able to operate at a very high frequency, a pedestal, said diode being welded on said pedestal, and a coaxial line with presettable impedance constituted by
   a cylindrical ring concentric to the diode, said ring being made from dielectric material and having an outer cylindrical surface and one of its ends metal-coated, the metal coated one end being welded on the pedestal,
   and a cylindrical mandrel having an external diameter smaller than the internal diameter of the cylindrical ring, said mandrel having a length slightly exceeding the length of said cylindrical ring, said mandrel having a convex end in contact with the diode and an opposite planar end, the external surface of said mandrel supporting at least one metal coating which is a good conductor of electricity.

2. A semiconductor device according to claim 1, wherein the mandrel is located in the passage of the ring, said convex end of the mandrel being in contact with the top of the diode, the base of the diode and the surface of the one end of the ring being fixed to a gold step which is welded to a screw support.

3. A semiconductor device according to claim 1, wherein the mandrel is a metallized glass fibre section, and the ring is a glass tube section whose relative dielectric constant ε is equal to or close to 6.

4. A semiconductor device according to claim 1, wherein the external diameters of the ring and of the mandrel are respectively substantially equal to 125 and 1000 microns, and wherein the length of the ring is between 1.23 and 1.8 mm for operating frequencies of approximately 1000 GHz.

* * * * *